United States Patent
Zhao

(10) Patent No.: US 9,966,470 B2
(45) Date of Patent: May 8, 2018

(54) FINFET STRUCTURE

(71) Applicant: SEMICONDUCTOR MANUFACTURING INTERNATIONAL (SHANGHAI) CORPORATION, Shanghai (CN)

(72) Inventor: Meng Zhao, Shanghai (CN)

(73) Assignee: Semiconductor Manufacturing International (Shanghai) Corporation, Shanghai (CN)

(*) Notice: Subject to any disclaimer, the term of this patent is extended or adjusted under 35 U.S.C. 154(b) by 0 days. days.

(21) Appl. No.: 15/269,946

(22) Filed: Sep. 19, 2016

(65) Prior Publication Data
US 2017/0012131 A1 Jan. 12, 2017

Related U.S. Application Data

(62) Division of application No. 14/839,915, filed on Aug. 28, 2015, now Pat. No. 9,502,569.

(30) Foreign Application Priority Data

Sep. 17, 2014 (CN) .......................... 2014 1 0475129

(51) Int. Cl.
H01L 29/78 (2006.01)
H01L 29/66 (2006.01)
H01L 29/06 (2006.01)
H01L 29/10 (2006.01)
H01L 21/265 (2006.01)
H01L 21/266 (2006.01)
H01L 21/324 (2006.01)
H01L 29/04 (2006.01)

(52) U.S. Cl.
CPC ........ *H01L 29/7853* (2013.01); *H01L 21/266* (2013.01); *H01L 21/26533* (2013.01); *H01L 21/26586* (2013.01); *H01L 21/324* (2013.01); *H01L 29/045* (2013.01); *H01L 29/0649* (2013.01); *H01L 29/1037* (2013.01); *H01L 29/66803* (2013.01); *H01L 29/66818* (2013.01); *H01L 29/7848* (2013.01)

(58) Field of Classification Search
CPC .......... H01L 29/7853; H01L 21/26533; H01L 21/26586; H01L 21/266; H01L 21/324; H01L 29/045; H01L 29/0649; H01L 29/1037; H01L 29/66803; H01L 29/66818; H01L 29/7848; H01L 29/66772; H01L 2027/11857; H01L 27/1203; H01L 29/7812; H01L 29/7824; H01L 29/785

See application file for complete search history.

(56) References Cited

U.S. PATENT DOCUMENTS

2008/0079003 A1* 4/2008 Shaheen ............... H01L 29/045
257/64
2013/0249003 A1* 9/2013 Oh ........................ H01L 21/845
257/347

(Continued)

*Primary Examiner* — Walter H Swanson
(74) *Attorney, Agent, or Firm* — Kilpatrick Townsend and Stockton LLP

(57) ABSTRACT

A FinFET device includes a substrate and a fin structure having a semiconductor material layer over the substrate and recessed regions on side walls of the fin structure. The recessed regions have openings facing away from the fin structure. The fin structure has a bottom portion below the recessed regions that is wider than a top portion.

12 Claims, 6 Drawing Sheets

(56) References Cited

U.S. PATENT DOCUMENTS

2014/0151761 A1* 6/2014 Hsieh ............... H01L 29/66545
                                                       257/288
2015/0011056 A1* 1/2015 Kapoor ............ H01L 29/78654
                                                       438/163

* cited by examiner

FINFET STRUCTURE

CROSS-REFERENCES TO RELATED APPLICATIONS

This application is a divisional of U.S. application Ser. No. 14/839,915, filed Aug. 28, 2015, which claims priority to Chinese patent application No. 201410475129.8, filed on Sep. 17, 2014, the contents of which are incorporated herein by reference in their entirety.

BACKGROUND OF THE INVENTION

The present invention relates to the field of semiconductor technology. Specifically, embodiments of the invention relate to FinFET (Fin Field Effect Transistor) devices, manufacturing methods, and related electronic devices.

With decreasing feature sizes of MOS devices, in its manufacturing process, effective control of the channel length of MOS devices become more challenging. Ultra-shallow junctions and abrupt junctions have improved the short channel effect in the core components. However, during the formation of ultra-shallow junctions and abrupt junctions, it is a challenging task to optimize a device structure to suppress the short channel effect and enhance the performance of MOS devices.

To overcome these problems, a variety of methods have been used to further improve the performance of MOS devices, such as pre-amorphous ion implantation (PAI) and stress technology. However, there are some shortcomings of these methods. For example, pre-amorphous ion implantation does not provide adequate control of the doping profiles of the source/drain regions of the MOS device, and stress techniques merely provide additional stress to the channel region of MOS devices to enhance their carrier mobility.

BRIEF SUMMARY OF THE INVENTION

A multiple gate field-effect transistor refers to a MOSFET (metal-oxide-semiconductor field-effect transistor) which incorporates more than one gate into a single device. In particular, a FinFET refers to a multiple-gate FET in which the conducting channel is a thin silicon "fin" structure. Embodiments of the present invention provide a FinFET transistor structure, its manufacturing method, and related electronic devices. In some embodiments, grooves or notches are formed on the sidewalls of the fin, and can effectively improve the carrier mobility and reduce short channel effect. However, the invention has much wider applicability.

According to some embodiments of the invention, a method for forming a FinFET device includes providing a substrate including a silicon substrate, a buried oxide layer, and a first semiconductor material layer, stacked from bottom to top; forming a hard mask layer having a pattern of a fin on the first semiconductor material layer; and removing a portion of the first semiconductor material layer using the hard mask layer as an etch mask. The method also includes forming side wall spacers on side walls of the first semiconductor material layer and the hard mask layer, and performing an angled oxygen ion implantation into a surface of the first semiconductor material layer that is exposed at both sides of the side wall spacers. The implantation is carried out at a first incline angle. The method further includes performing an annealing process to form oxide diffusion regions in the first semiconductor material layer, and removing the oxide diffusion regions to form recessed regions in the first semiconductor material layer. The method includes removing another portion of the first semiconductor material layer that are not shielded by the hard mask layer and the side wall spacers to expose the buried oxide layer below, and removing the hard mask layer and the side wall spacers to form a fin structure having recessed regions on the sides of the fin. The recess regions have openings facing away from the fin.

In an embodiment of the above method, the first incline angle is about 10-30 degrees. In an embodiment, the oxygen ion implantation has an implantation dose of 1 $e^{15}$-1 $e^{16}$/cm$^2$ at an implantation energy of 1-10 keV. In an embodiment, the first semiconductor material layer surface crystal orientation is <110>, <100>, or <111> crystallographic orientation. In some embodiments, the first semiconductor material layer comprises silicon or silicon-germanium material. In some embodiments, the height of the side wall spacers is 10~30 nm, and the width of the side wall spacers is 2 nm~6 nm. In some embodiments, the annealing process comprises a low temperature annealing process.

According to some embodiments of the invention, a FinFET device includes a substrate, and a fin structure of a semiconductor material over the substrate. The fin structure has grooves or notches on its side walls. The grooves or notches have openings facing away from the fin structure.

In some embodiments of the above FinFET device, the FinFET device also includes a dielectric layer over the substrate and under the fin structure. In some embodiments, the first semiconductor material layer comprises silicon or silicon-germanium material. In some embodiments, the fin structure includes a top portion above the notches and a bottom portion below the notches, and the bottom portion is wider than the top portion. In some embodiments, the width of the fin structure at the recessed regions is about 10~60 nm.

Some embodiments of the invention also provide an electronic apparatus that includes a FinFET device described herein.

The following description, together with the accompanying drawings, will provide further understanding of the nature and advantages of the claimed invention.

DETAILED DESCRIPTION OF THE INVENTION

Figure 1A:
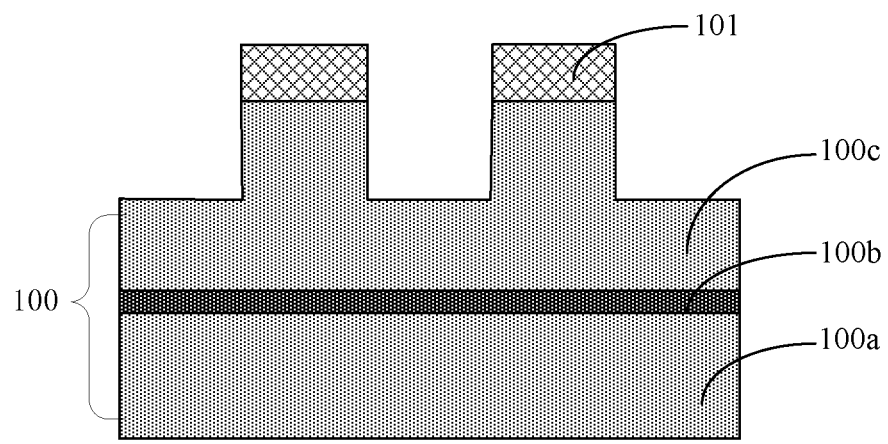
FIGS. 1A-1G are schematic diagrams showing cross-sectional views of a method for forming a device according to an embodiment of the present invention.

Embodiments of the present invention provide a FinFET transistor structure, its manufacturing method, and related electronic devices. In some embodiments, grooves or notches are formed on the sidewalls of the fin, and can effectively improve the carrier mobility and reduce short channel effect.

In the following description, numerous specific details are provided for a thorough understanding of the present invention. However, it should be appreciated by those of skill in the art that the present invention may be realized without one or more of these details. In other examples, features and techniques known in the art will not be described for purposes of brevity.

It should be understood that the drawings are not drawn to scale, and similar reference numbers are used for representing similar elements. Embodiments of the invention are described herein with reference to cross-section illustrations that are schematic illustrations of idealized embodiments (and intermediate structures) of the invention. The thickness of layers and regions in the drawings may be exaggerated relative to each other for clarity. Additionally, variations in the illustrated shapes resulting, for example, from manufacturing techniques and/or tolerances, are to be expected. Thus, embodiments of the invention should not be construed as limited to the particular shapes of regions illustrated herein but are to include deviations in shapes that result, for example, from manufacturing.

It will be understood that, when an element or layer is referred to as "on," "disposed on," "adjacent to," "connected to," or "coupled to" another element or layer, it can be disposed directly on the other element or layer, adjacent to, connected or coupled to the other element or layer, or intervening elements or layers may also be present. In contrast, when an element is referred to as being "directly on," directly disposed on," "directly connected to," or "directly coupled to" another element or layer, there are no intervening elements or layers present between them. It will be understood that, although the terms "first," "second," "third," etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Relative terms, or spatial relationship terms, such as "under," "below," "underneath," "over," "on," "above," "bottom," and "top" are used herein to describe a relationship of one element, layer or region to another element, layer or region as illustrated in the figures. It will be understood that these terms are intended to encompass different orientations of the structure in addition to the orientation depicted in the figures. For example, if the device shown in the figures is flipped, the description of an element being "below" or "underneath" another element would then be oriented as "above" the other element. Therefore, the term "below," "under," or "underneath" can encompass both orientations of the device. Because devices or components of embodiments of the present invention can be positioned in a number of different orientations (e.g., rotated 90 degrees or at other orientations), the relative terms should be interpreted accordingly.

The terms "a," "an," and "the" may include singular and plural references. It will be further understood that the terms "comprising," "including," "having" and variants thereof, when used in this specification, specify the presence of stated features, steps, operations, elements, and/or components, but do not preclude the presence or addition of one or more other features, steps, operations, elements, components, and/or groups thereof. Furthermore, as used herein, the words "and/or" may refer to and encompass any possible combinations of one or more of the associated listed items.

The use of the terms first, second, etc. do not denote any order, but rather the terms first, second, etc. are used to distinguish one element from another. Furthermore, the use of the terms a, an, etc. does not denote a limitation of quantity, but rather denote the presence of at least one of the referenced items.

The term "vertical" as used in this application is defined as a plane perpendicular to the conventional plane or surface of a wafer or substrate, regardless of the orientation of the wafer or substrate. The term "horizontal" refers to a direction perpendicular to the vertical as defined above.

Embodiments of the invention are described herein with reference to cross-section illustrations that are schematic illustrations of idealized embodiments (and intermediate structures) of the invention. For example, an implanted region illustrated as a rectangle will, typically, have rounded or curved features and/or a gradient of implant concentration at its edges rather than a discrete change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Prepositions, such as "on," "side" (as in "sidewall"), "below," "above." "higher," "lower," "over," and "under" are defined with respect to the conventional plane or surface being on the top surface of the wafer or substrate, regardless of the orientation of the wafer or substrate. It will be understood that these terms are intended to encompass different orientations of the device in addition to the orientation depicted in the figures.

The description below is presented with reference to a series of drawing figures enumerated above. These diagrams are merely examples, and should not unduly limit the scope of the claims herein. In connection with the various aspects illustrated and described, one of ordinary skill in the art would recognize other variations, modifications, and alternatives.

FIGS. 1A-1G are schematic diagrams showing cross-sectional views of a method for forming a device according to an embodiment of the present invention. First, as shown in FIG. 1A, a substrate 100 includes, from bottom to top, a silicon substrate 100a, a buried oxide layer 100b, and a first semiconductor material layer 100c. Depending on the embodiments, first layer of semiconductor material layer 100c can be silicon or silicon germanium, or another semiconductor material. In some embodiments, the first semiconductor material layer 100c can have a surface crystal orientation of <110>, <100>, or <111> crystallographic orientation.

The method includes forming a hard mask layer 101 having a fin pattern on first semiconductor material layer 100c. Hard mask layer 101 can include one or more of an oxide layer, a nitride layer, an oxynitride layer, or an amorphous carbon. The oxide layer can include borophosphosilicate glass (BPSG), phosphosilicate glass (PSG), tetraethyl orthosilicate (TEOS), undoped silicate glass (USG), spin-on glass (SOG), high density plasma (HDP), or spin-on dielectric (SOD). The nitride layer can include a nitride Silicon ($Si_3N_4$) layer. The oxynitride layer can include silicon oxynitride (SiON) layer. The method of forming a hard mask layer 101 may be one of the conventional methods, e.g., chemical vapor deposition (CVD), low-temperature chemical vapor deposition (LTCVD), low pressure chemical vapor deposition (LPCVD), rapid thermal chemical vapor deposition (RTCVD), plasma enhanced chemical vapor deposition (PECVD), etc. In an example, hard mask layer 101 may be formed on the first semiconductor material layer 100c, and a photoresist layer is then formed on hard mask layer 101, and then the photoresist layer is exposed using a fin structure mask for making FinFET. The photoresist layer is then etched using the photoresist as the etching mask to form the hard mask layer 101 with a fin pattern.

Next, hard mask layer 101 is used as an etching mask to remove a portion of first semiconductor material layer 100c. Either dry etching or wet etching can be used to remove the portion of the first semiconductor material layer 100c. For example, dry etching can be performed by an anisotropic etching method based on carbon fluoride gas. Wet etching can be performed using a hydrofluoric acid solution, e.g., buffered oxide etchant (buffer oxide etchant (BOE)) or hydrofluoric acid buffer solution (BHF).

Figure 1B:
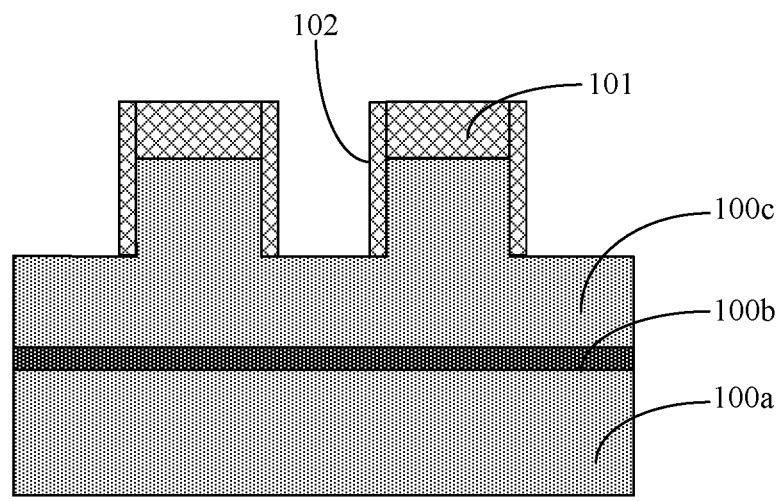

In FIG. 1B, side wall spacers 102 are formed on sidewalls of the patterned semiconductor material layer 100c and hard mask layer 101. Side wall spacers 102 can be formed with oxide, nitride or a combination of both. The side wall spacers can be formed by deposition and etching techniques. In some embodiments, the height of the side wall spacers can be 10~30 nm, and the width of the sidewall spacers can be 2 nm~6 nm. The spacers are used to protect the sidewalls of the fin in the subsequent ion implantation.

Figure 1C:
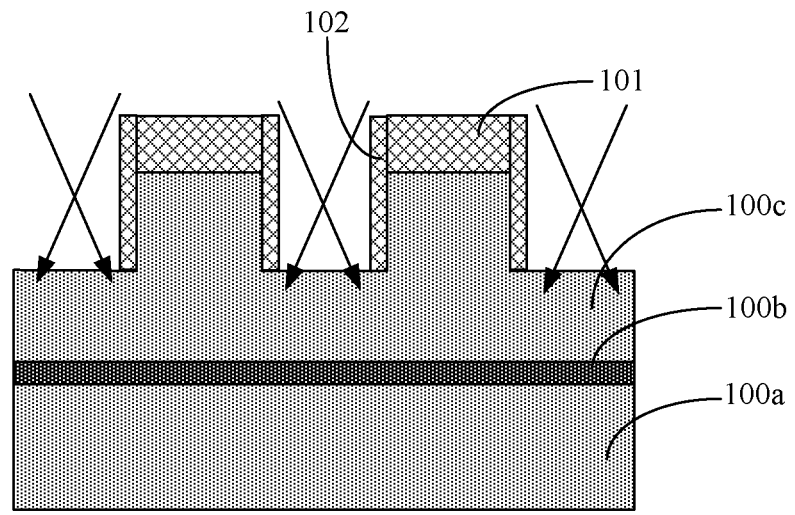

Next, as shown in FIG. 1C, an oxygen ion implantation is performed to first semiconductor material layer 100c that is exposed on both sides of the spacers 102. The ion implantation is an angled implant carried out at an inclined angle with respect to the surface of first semiconductor material layer 100c. The angle is referred to as the first inclination angle which, in some embodiments, can be 10-35 degrees. In an example, the oxygen ion implantation has an implantation dose of 1 $e^{15}$-1 $e^{16}$/cm² at an implantation energy of 1-10 keV.

Figure 1D:
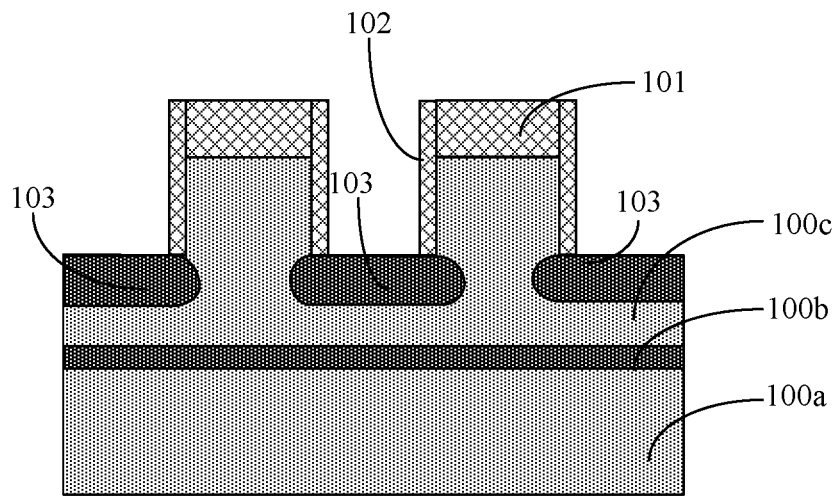

In FIG. 1D, an annealing process is performed on the semiconductor material to form oxide diffusion regions 103 within the first semiconductor material layer 100c. The implanted oxygen ions are diffused in first semiconductor material layer 100c and form oxide. The oxide material in diffusion regions 103 is determined by the material of first semiconductor material layer 100c. For example, if the first semiconductor material layer 100c is silicon, then the oxide diffusion region includes silicon oxide. The annealing process can be selected from furnace annealing, rapid thermal annealing, and laser annealing, etc. In some embodiments, the annealing process is a low temperature annealing treatment. For example, the low-temperature annealing can be carried out in a temperature range of 400~700° C., and an annealing time of 1~10 hours. In the proceeding steps, the oxygen ions have already been implanted into the first semiconductor material layer 100c, and therefore the oxide in diffusion regions 103 can be formed at a relatively low annealing temperature. But the invention is not limited to low-temperature annealing, and annealing any suitable manner that is capable of forming an oxide diffusion region 103 can be used in the embodiments of the present invention.

Figure 1E:
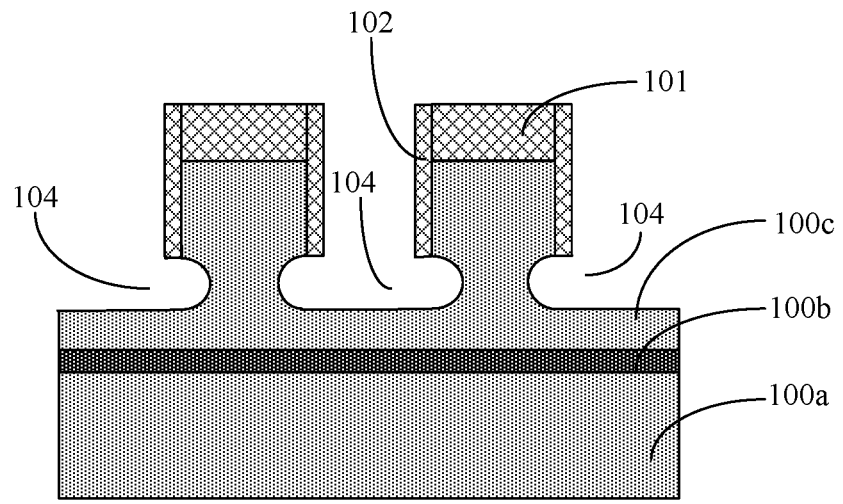

In FIG. 1E, oxide diffusion regions 103 are removed in the first semiconductor material layer 100c to form trenches 104. The oxide diffusion regions 103 can be etched using known techniques. For example, the etch can be carried out using reactive ion etching (RIE), wet etching, or dry etching methods for selectively etching the oxide regions with respect to the semiconductor material layer 100c. In some embodiments of the present embodiment, the oxide diffusion regions are etched using highly selective wet etching, e.g., using the etching solution of hydrofluoric acid or hydrobromic acid.

Figure 1F:
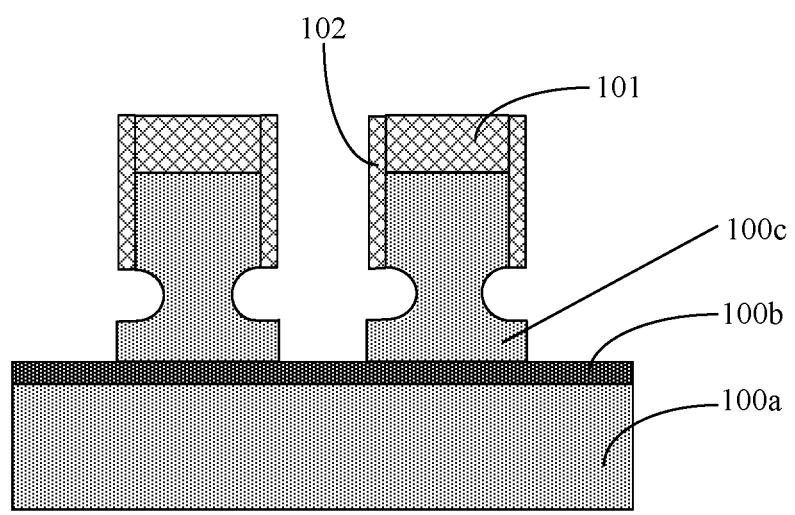

In FIG. 1F, the portions of first semiconductor material 100c that are not shielded by hard mask layer 101 and side wall spacers 102 are etched to expose the buried oxide layer 100b below first semiconductor material 100c. In some embodiments, the etching is carried out by plasma dry etching, with the etching gas including, e.g., a mixed gas of hydrogen and oxygen or hexafluoro butadiene.

Figure 1G:
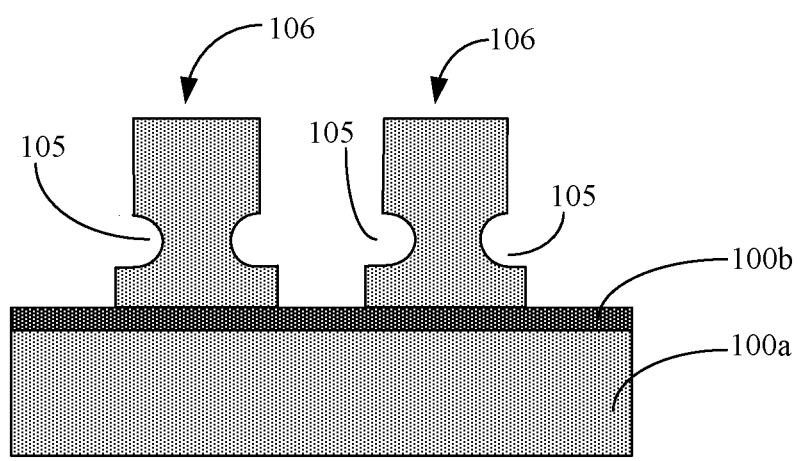

In FIG. 1G, the hard mask and the sidewall spacers are removed to form fin structures 106. Each fin structure 106 has recess regions 105 on its sidewalls. Recessed regions 105 are also referred to as grooves or notches. As shown in FIG. 1G, the grooves or recess regions have openings facing away from the body of the fin structure. An etching method with high selectivity can be used to remove the hard mask layer and side walls. In one example, when the materials of the hard mask layer and the sidewalls are silicon nitride, the etch can be carried out using a dry etching process that includes, but is not limited to: reactive ion etching (RIE), ion beam etching, plasma etching, or laser cutting. The etching method can be selected based on the material properties of the mask layer and the sidewall.

As shown in FIG. 1G, recess regions 105 are formed on the sidewalls of fin 106. The recess regions 105 have openings facing toward the outside of the fin body 106. It is noted that the portion of fin 106 above the recess regions is narrower than the lower portion of the fin below the recess regions. That is, fin 106 has a shape that is narrower at the top and wider at the bottom. In an example, the distance between the deepest part of recess 105 and a centerline of fin 106 perpendicular to the surface of substrate 100 is 5~30 nm. In some examples, the width of the fin at the recess regions can be about 10~60 nm.

Described above is an embodiment of the process of making the fins of the device. Advantages of the method and device include a balanced effect of suppressing the short channel effect and enhancing the channel carrier mobility, and more effectively promotion of Fin carrier mobility.

To complete the FinFET device, additional process steps can be carried out as described below, but not illustrated in drawing figures. The method can further include forming a gate stack on the top surface and on both sides of the fin. As an example, the gate stack structure includes, from the bottom to the top, a gate dielectric layer and a layer of gate material. The gate dielectric layer can include an oxide layer, such as a silicon dioxide ($SiO_2$) layer. The gate material layer can include one or more of a polysilicon layer, a metal layer, a conductive metal nitride layer, a conductive metal oxide layer, and a metal silicide layer, etc.

Next, the silicon-containing material layer is doped to form source and drain regions. In some embodiments, for PMOS, the dopants are phosphorus ions; for NMOS, the dopants boron ions. A dopant ion concentration gradient may be formed, thereby further suppressing the short channel effect and to achieve better control sheet resistance value (Rs). In the present embodiment, doping can be carried out during the epitaxial growth of the silicon-containing material layer. It may be carried out using the ion implantation, by controlling the implantation energy and implantation dose of implanted ions at different stages to form dopant concentration gradient. The silicon-containing material layer plays a role in the controlled lateral diffusion of dopants in the channel.

Then, a silicon-containing material layer is formed on the exposed fin structure after the gate stack and source and drain formation. For example, for PMOS, the silicon-containing material layer can include a silicon-germanium (SiGe) layer. For NMOS, the silicon-containing material layer can include a silicon carbon (SiC) layer. The silicon-containing material layer may exert stress on the fin, thus enhancing the carrier mobility in the channel layer. The silicon-containing material layer can also form raised source and drain regions. The silicon-containing material layer can be formed using a variety of suitable processes, such as a selective epitaxial growth process.

Figure 2:
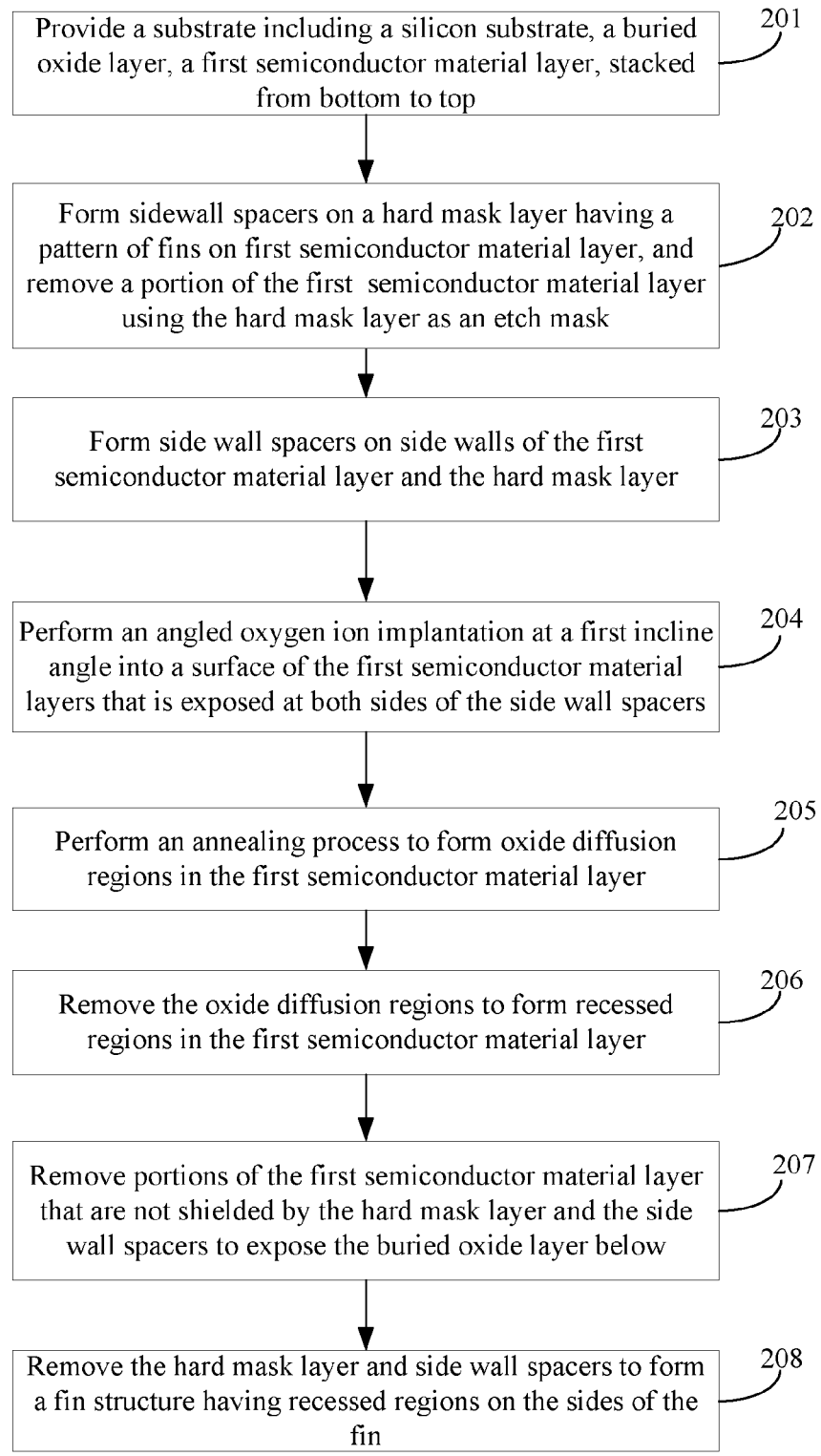
FIG. 2 is a simplified flow chart illustrating a method for forming a device according to an embodiment of the present invention.

In summary, according to embodiments of the present invention, a fin device can be formed to have side wall recess regions by angled implantation of oxygen ions into the substrate. This device structure can have a balanced effect in suppressing the short channel effect and improving channel carrier mobility, thus significantly improving the performance of the device FIG. 2 is a simplified flow chart illustrating a method for forming a device according to an embodiment of the present invention. The method can be summarized as follows.

In step 201, provide a substrate including a silicon substrate, a buried oxide layer, a first semiconductor material layer, stacked from bottom to top;

In step 202, form sidewall spacers on a hard mask layer having a pattern of fins on the first semiconductor material layer, and remove a portion of the first semiconductor material layer using the hard mask layer as an etch mask;

In step 203, form side wall spacers on the side walls of the first semiconductor material layer and the hard mask layer;

In step 204, perform an angled oxygen ion implantation into a surface of the first semiconductor material layer that is exposed at both sides of the side wall spacers, the implant being carried out at a first incline angle;

In step 205, perform an annealing process to form oxide diffusion regions in the first semiconductor material layer;

In step 206, remove the oxide diffusion regions to form recessed regions in the first semiconductor material layer;

In step 207, remove portions of the first semiconductor material layer that are not shielded by the hard mask layer and the side wall spacers to expose the buried oxide layer below;

In step 208, remove the hard mask layer and the side wall spacers to form a fin structure having recessed regions on the sides of the fin. The recess regions have openings facing away from the fin structure.

Depending on the embodiments, the method can also include additional process steps to complete the FinFET device. For example, a gate stack can be formed on the fin structure. The gate stack extends in a direction perpendicular to the fin structure. The gate stack can include, from the bottom to the top, a gate dielectric layer and a layer of gate material. Then, a silicon-containing material layer is formed on the exposed fin structure after the gate stack formation to form raised source and drain structures. For example, for PMOS, the silicon-containing material layer can include a silicon-germanium (SiGe) layer. For NMOS, the silicon-containing material layer can include a silicon carbon (SiC) layer. The silicon-containing material layer may exert stress on the fin, thus enhancing the carrier mobility in the channel layer. Next, the silicon-containing material layer is doped to form source and drain regions. In some embodiments, for PMOS, the dopants are phosphorus ions; for NMOS, the dopants boron ions.

Figure 3:
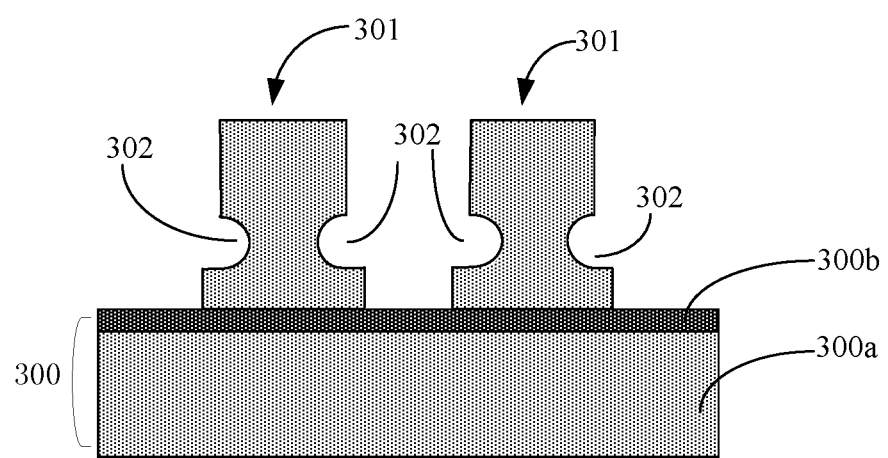
FIG. 3 is a schematic diagram showing a cross-sectional view of a FinFET device according to an embodiment of the present invention.

FIG. 3 is a schematic diagram showing a cross-sectional view of a FinFET device according to the present invention. As shown in FIG. 3, the FinFET device includes a semiconductor substrate 300. Semiconductor substrate 300 may include at least one of the following materials: silicon, silicon on insulator (SOI), silicon-on-insulator laminate (SSOI), silicon germanium-on-insulator laminate (S—Si-GeOI), silicon germanium-on-insulator (SiGeOI), and germanium-on-insulator (GeOI), and so on. As shown in FIG. 3, semiconductor substrate 300 includes a silicon substrate 300a and a buried oxide layer 300b stacked from bottom to top.

The device in FIG. 3 includes a fin structure 301 on semiconductor substrate 300. Fin structure 301 includes recess regions or notches 302 on the side of the fin, and recessed regions or notches 302 have openings toward the outside of the fin structure. In an example, the distance between the deepest part of the recess and a centerline of the fin structure perpendicular to the surface of substrate is 5~30 nm. In some examples, the width of the fin at the recess regions can be about 10~60 nm. In some embodiments, the material for the fin structure can include silicon or silicon germanium. In some embodiments, the portion of fin structure 301 above the recess regions 302 is narrower than the lower portion of the fin below the recess regions. That is, fin structure 301 has a shape that is narrower at the top and wider at the bottom. In some embodiments, the difference in widths can be 4~12 nm.

Depending on the embodiments, the FinFET device can also include additional structures. For example, the FinFET device can include a gate stack formed on the fin structure. The gate stack extends in a direction perpendicular to the fin structure. The gate stack can include, from the bottom to the top, a gate dielectric layer and a layer of gate material. The FinFET device can also include a silicon-containing material layer formed on the exposed fin structure after the gate stack and source and drain formation to form raised source and drain structures. For example, for PMOS, the silicon-containing material layer can include a silicon-germanium (SiGe) layer. For NMOS, the silicon-containing material layer can include a silicon carbon (SiC) layer. The silicon-containing material layer may exert stress on the fin, thus enhancing the carrier mobility in the channel layer.

Thus, embodiments of the present invention provide a FinFET device with a fin structure that has a special shape. The fin structure has grooved side surfaces, also referred to as notches or recessed regions. The recessed regions are concave in shape, which are formed on the side of the fin structure with openings toward the outside of the fin structure. The concave channel shape enables more gate control capability over conventional multiple-gate FETs. This device structure can provide a balanced effect in suppressing the short channel effect and improving channel carrier mobility, thus significantly improving the performance of the device Embodiments of the present invention also provide an electronic apparatus that includes the above-described FinFET device. By including the FinFET device, the electronic apparatus can have excellent performance, with the advantages described above. The electronic device may include a mobile phone, tablet PCs, laptops, netbooks, game consoles, televisions, VCD, DVD, navigation, camera, video camera, voice recorder, MP3, MP4, PSP, and other electronic products or equipment. Embodiments of the present invention also provide intermediate products having the above-described semiconductor device, for example: a mobile phone motherboard that includes the integrated circuit, and the like.

While the present invention is described herein with reference to illustrative embodiments, this description is not intended to be construed in a limiting sense. Rather, the purpose of the illustrative embodiments is to make the spirit of the present invention be better understood by those skilled in the art. In order not to obscure the scope of the invention, many details of well-known processes and manufacturing techniques are omitted. Various modifications of the illustrative embodiments as well as other embodiments will be apparent to those of skill in the art upon reference to the description. For example, although certain structures and examples of the device are described with respect to FinFET, it is understood that the techniques can be used with other devices. It is therefore intended that the appended claims encompass any such modifications.

Furthermore, some of the features of the preferred embodiments of the present invention could be used to advantage without the corresponding use of other features. As such, the foregoing description should be considered as merely illustrative of the principles of the invention, and not in limitation thereof.

What is claimed is:

1. A FinFET device, comprising:
a substrate; and
a fin structure comprising a semiconductor material layer over the substrate, recessed regions on its side walls, the recessed regions having openings facing away from the fin structure, and a top portion directly above the recessed regions having flat vertical surfaces.

2. The device of claim 1, wherein the recessed regions have a concave shape.

3. The device of claim 1, further comprising:
a dielectric layer over the substrate and under the fin structure.

4. The device of claim 1, wherein the width of the fin structure at the recessed regions is about 10~60 nm.

5. The device of claim 1, wherein the fin structure further comprises a bottom portion below the recessed regions, and the bottom portion is wider than the top portion.

6. The device of claim 5, wherein the bottom portion of the fin structure is wider than the top portion by about 4~12 nm.

7. The device of claim 1, wherein the semiconductor material layer has a surface crystal orientation of <110>, <100>, or <111>.

8. The device of claim 1, wherein the semiconductor material layer comprises a silicon or silicon-germanium material.

9. An electronic apparatus, comprising a FinFET device, wherein the FinFET device comprises:
a substrate; and
a fin structure comprising a semiconductor material layer over the substrate, recessed regions on its side walls, the recessed regions having openings facing away from the fin structure, and a top portion directly above the recessed regions having flat vertical surfaces.

10. The electronic apparatus of claim 9, wherein the recessed regions have a concave shape.

11. The electronic apparatus of claim 9, wherein the FinFET device further comprises a buried oxide layer disposed between the substrate and the semiconductor material layer.

12. The electronic apparatus of claim 9, wherein the fin structure further comprises a bottom portion below the recessed regions, and the bottom portion is wider than the top portion.

* * * * *